(12) United States Patent
Choi

(10) Patent No.: US 11,462,258 B2
(45) Date of Patent: Oct. 4, 2022

(54) MEMORY DEVICE AND OPERATION METHOD THEREOF

(71) Applicant: SK hynix Inc., Gyeonggi-do (KR)

(72) Inventor: Hyung Jin Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/097,849

(22) Filed: Nov. 13, 2020

(65) Prior Publication Data

US 2022/0020418 A1 Jan. 20, 2022

(30) Foreign Application Priority Data

Jul. 16, 2020 (KR) .......................... 10-2020-0088433

(51) Int. Cl.
*G11C 5/14* (2006.01)
*G11C 11/4074* (2006.01)
*G11C 7/06* (2006.01)
*G11C 11/408* (2006.01)

(52) U.S. Cl.
CPC .......... *G11C 11/4074* (2013.01); *G11C 7/065* (2013.01); *G11C 11/4082* (2013.01); *G11C 11/4087* (2013.01)

(58) Field of Classification Search
CPC . G11C 11/4074; G11C 7/065; G11C 11/4082; G11C 11/4087; G11C 17/18; G11C 17/16
USPC ................................................... 365/226, 96
See application file for complete search history.

(56) References Cited

U.S. PATENT DOCUMENTS

| 2002/0060924 A1* | 5/2002 | Ito | G11C 7/12 |
| | | | 365/149 |
| 2007/0002631 A1* | 1/2007 | Kang | G11C 11/5628 |
| | | | 365/185.21 |
| 2015/0109875 A1* | 4/2015 | Okuda | G11C 8/10 |
| | | | 365/230.06 |
| 2016/0111138 A1* | 4/2016 | Izumi | G11C 11/221 |
| | | | 365/65 |

FOREIGN PATENT DOCUMENTS

KR 10-0417899 5/2004
KR 10-2019-0122422 10/2019

* cited by examiner

*Primary Examiner* — Huan Hoang
(74) *Attorney, Agent, or Firm* — IP & T Group LLP

(57) ABSTRACT

A memory device and an operating method thereof are provided. The memory device includes a latch configured to sense a voltage or a current of a bit line coupled to a memory cell and store read data, a transmission circuit configured to output the read data stored in the latch through a page bus line in response to a transmission signal, a cache latch configured to receive the read data through the page bus line and temporarily store the read data, and a pump voltage output circuit coupled to the transmission circuit through a transmission line and configured to apply a second voltage greater than a first voltage after applying the first voltage to the transmission line for a set time.

18 Claims, 8 Drawing Sheets

MEMORY DEVICE AND OPERATION METHOD THEREOF

CROSS-REFERENCE TO RELATED APPLICATION

The present application claims priority under 35 U.S.C. § 119(a) to Korean patent application number 10-2020-0088433 filed on Jul. 16, 2020, which is incorporated herein by reference in its entirety.

BACKGROUND

Field of Invention

Various embodiments of the present disclosure generally relate to a memory device and a method of operating the same, and more particularly, to a memory device including a page buffer and a method of operating the memory device.

Description of Related Art

Memory devices may include memory blocks storing data therein, a peripheral circuit, which is a group of circuits/components, for performing a program operation, a read operation, or an erase operation on the memory blocks, and a logic circuit controlling the peripheral circuit.

The peripheral circuit may generate a program voltage, a read voltage, and an erase voltage to be applied to word lines coupled to the memory blocks. The peripheral circuit may store data input from an external device in the memory blocks, read the stored data from the memory blocks, output the read data to the external device, and erase the stored data from the memory blocks.

The logic circuit may include software and hardware controlling the peripheral circuit in response to a command input from the external device. For example, the software included in the logic circuit may control the hardware in response to the command and the hardware may control the peripheral circuit by outputting various voltages and signals in response to the control of the software.

SUMMARY

Various embodiments of the present disclosure are directed to a memory device capable of suppressing a voltage drop of a signal controlling page buffers included in the memory device and a method of operating the memory device.

According to an embodiment, a memory device may include a latch configured to sense a voltage or a current of a bit line coupled to a memory cell and store read data, a transmission circuit configured to output the read data stored in the latch through a page bus line in response to a transmission signal, a cache latch configured to receive the read data through the page bus line and temporarily store the read data, and a pump voltage output circuit coupled to the transmission circuit through a transmission line and configured to apply a second voltage greater than a first voltage after applying the first voltage to the transmission line for a set time.

According to an embodiment, a memory device may include a switch transferring data on a first line to a second line in response to a transmission signal, and a pump voltage output circuit coupled to a gate of the switch and outputting the transmission signal to the gate, wherein the pump voltage output circuit is configured to increase a potential of the gate to a first voltage before the data is transferred to the second line, and output the transmission signal of a second voltage greater than the first voltage to the gate when the data is transferred to the second line.

According to an embodiment, a method of operating a memory device may include storing read data in a latch of a page buffer by reading a memory cell, precharging a gate of a transmission switch coupled between the latch and a cache latch by applying a first voltage to the gate, and turning on, when the gate is precharged, the transmission switch by applying a second voltage greater than the first voltage to the gate.

According to an embodiment, a memory device may include page buffers configured to provide data in response to a common signal of a target voltage level; cache latches configured to latch the provided data from the respective page buffers; and a control circuit configured to provide the common signal through a common line by increasing the common signal to precharge the common line to an intermediate voltage level and then increasing the common signal to the target voltage level.

DETAILED DESCRIPTION

Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Figure 1:
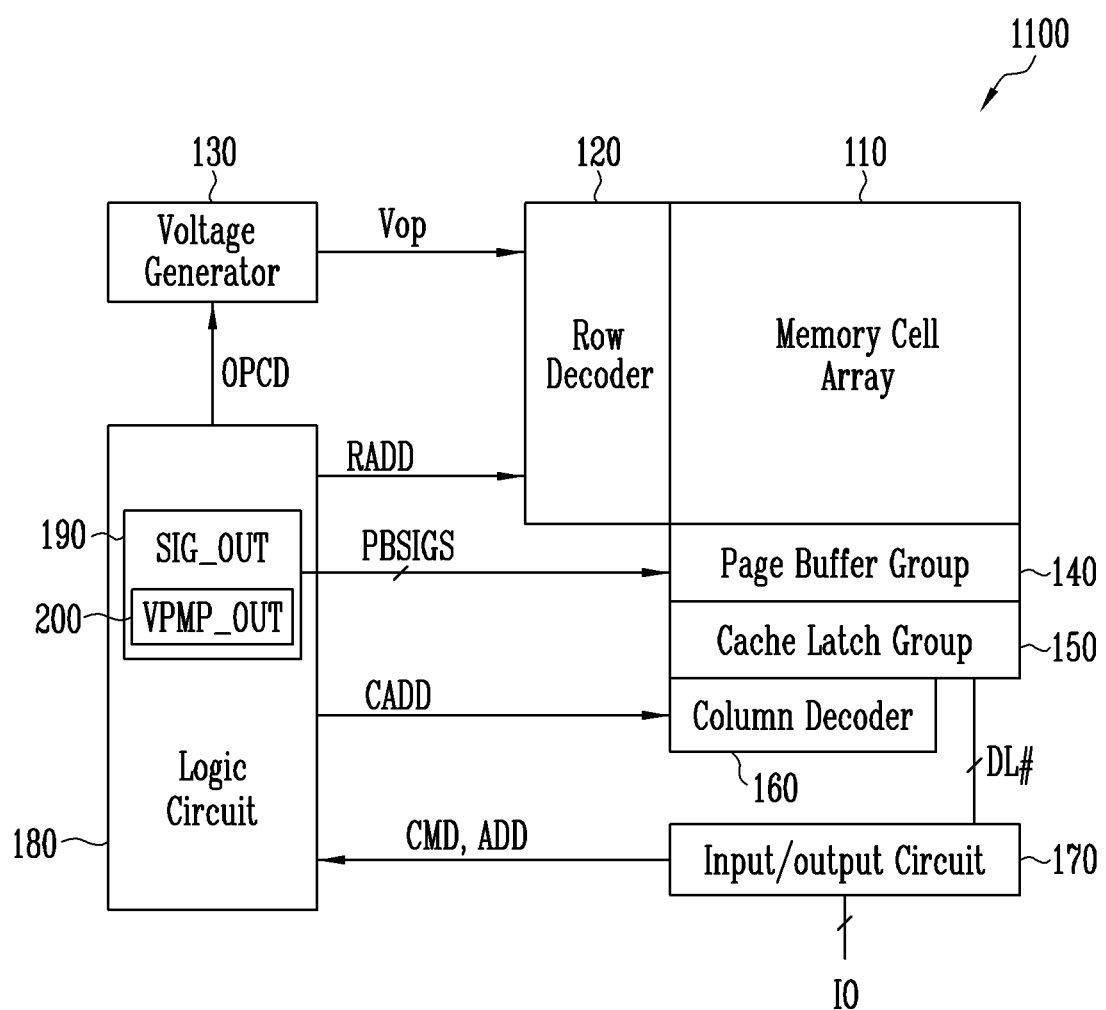
FIG. 1 is a diagram illustrating a memory device according to an embodiment of the present disclosure.

FIG. 1 is a diagram illustrating a memory device 1100 according to an embodiment of the present disclosure.

Referring to FIG. 1, the memory device 1100 may include a memory cell array 110, a row decoder 120, a voltage generator 130, a page buffer group 140, a cache latch group 150, a column decoder 160, an input/output circuit 170, and a logic circuit 180.

The memory cell array 110 may include a plurality of memory blocks storing data. Each of the memory blocks may include a plurality of memory cells. Each of the memory cells may have a two-dimensional structure where the memory cells are arranged in parallel with a substrate or a three-dimensional structure where the memory cells are stacked in a vertical direction to the substrate.

The row decoder 120 may select one memory block among the memory blocks in the memory cell array 110 in response to a row address RADD and transfer operating voltages Vop being input to the selected memory block.

The voltage generator 130 may generate and output the operating voltages Vop used to perform various operations in response to an operation code OPCD. For example, the voltage generator 130 may generate and output the operating voltages Vop including a program voltage, a verify voltage, a read voltage, an erase voltage, and a pass voltage.

The page buffer group 140 may be coupled to the memory cell array 110 through bit lines. For example, the page buffer group 140 may include page buffers coupled to the bit lines, respectively. The page buffers may simultaneously operate in response to page buffer control signals PBSIGS and temporarily store data during a program or read operation. A verify operation performed in a program operation and an erase verify operation performed in an erase operation may be performed in the same manner as a read operation. During the verify operation, the page buffers may precharge the bit lines to sense a threshold voltage of the memory cells and may sense data from the memory cells according to a voltage or a current of the bit lines.

The cache latch group 150 may temporarily store data input from the external device through data lines DL# and transfer the data to the page buffer group 140 in response to control of the column decoder 160. In addition, the cache latch group 150 may receive and temporarily store the data read from the page buffer group 140 and output the data through the data lines DL# in response to the control of the column decoder 160.

The column decoder 160 may control the cache latch group 150 to transfer the data in response to a column address CADD. For example, when data is temporarily stored in the cache latch group 150, the column decoder 160 may control the cache latch group 150 in response to the column address CADD, such that the data temporarily stored in the cache latch group 150 is transferred to the page buffer group 140. Alternatively, the column decoder 160 may control the cache latch group 150 in response to the column address CADD, such that the data stored in the page buffer group 140 is transferred to the cache latch group 150.

The input/output circuit 170 may communicate with the external device through input/output lines IO. The external device may be a controller controlling the memory device 1100. The input/output circuit 170 may receive a command CMD, an address ADD, and data from the external device through the input/output lines IO or output the data received from the cache latch group 150 to the external device. The input/output circuit 170 may transfer the command CMD and the address ADD received through the input/output lines IO to the logic circuit 180 and may transfer the data to the cache latch group 150.

The logic circuit 180 may output the operation code OPCD, the row address RADD, the page buffer control signals PBSIGS, and the column address CADD in response to the command CMD and the address ADD. The logic circuit 180 may include software performing an algorithm for various operations in response to the command CMD and hardware configured to output various signals in response to control of the software. For example, the logic circuit 180 may output the row address RADD and the column address CADD by decoding the address ADD and output the operation code OPCD and the page buffer control signals PBSIGS in response to the command CMD. The logic circuit 180 may include a signal output circuit (SIG_OUT) 190 outputting the page buffer control signals PBSIGS. The signal output circuit 190 may output the page buffer control signals PBSIGS having various voltage levels and include a pump voltage output circuit (VPMP_OUT) 200 for outputting a signal having a second voltage level among the page buffer control signals PBSIGS.

Figure 2:
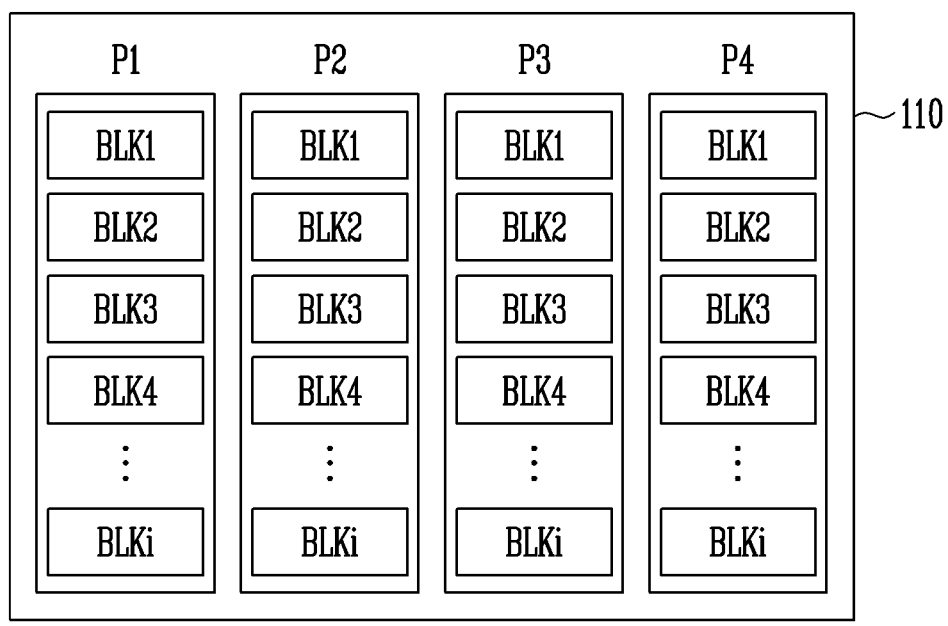
FIG. 2 is a diagram illustrating a memory cell array.

FIG. 2 is a diagram illustrating the memory cell array 110.

Referring to FIG. 2, the memory cell array 110 may be formed to have a single-plane structure or a multi-plane structure. The single-plane structure may refer to a structure where the memory cell array 110 has a single plane and the multi-plane structure may refer to a structure where the memory cell array 110 has a plurality of planes. FIG. 2 illustrates the memory cell array 110 having the multi-plane structure.

The memory cell array 110 may include first, second, third, and fourth planes P1, P2, P3, and P4. The first, second, third, and fourth planes P1, P2, P3, and P4 may be coupled to different row decoders and different page buffers, respectively. Each of the first, second, third, and fourth planes P1, P2, P3, and P4 may include a plurality of memory blocks BLK1 to BLKi, where i is a positive integer of 2 or greater. Different physical addresses may be allocated to the first, second, third, and fourth planes P1, P2, P3, and P4, respectively. Also, different physical addresses may be allocated to the plurality of memory blocks BLK1 to BLKi, respectively.

The first, second, third, and fourth planes P1, P2, P3, and P4 may be simultaneously selected during a program, read, or erase operation, and selected memory blocks of the first, second, third, and fourth planes P1, P2, P3, and P4 may be the same or different according to a row address. For example, a first memory block BLK1 of the first plane P1, a third memory block BLK3 of the second plane P2, a second memory block BLK2 of the third plane P3, and a first memory block BLK1 of the fourth plane P4 may be selected according to the row address.

For example, during a program operation, when data is input to page buffers coupled to the first, second, third, and fourth planes P1, P2, P3, and P4, respectively, the program operation may be performed on selected memory blocks of the first, second, third, and fourth planes P1, P2, P3, and P4 at the same time. During a read operation, the read operation of the selected memory blocks of the first, second, third, and fourth planes P1, P2, P3, and P4 may be performed at the same time. During an erase operation, the erase operation of the selected memory blocks of the first, second, third, and fourth planes P1, P2, P3, and P4 may be performed at the same time.

Figure 3:
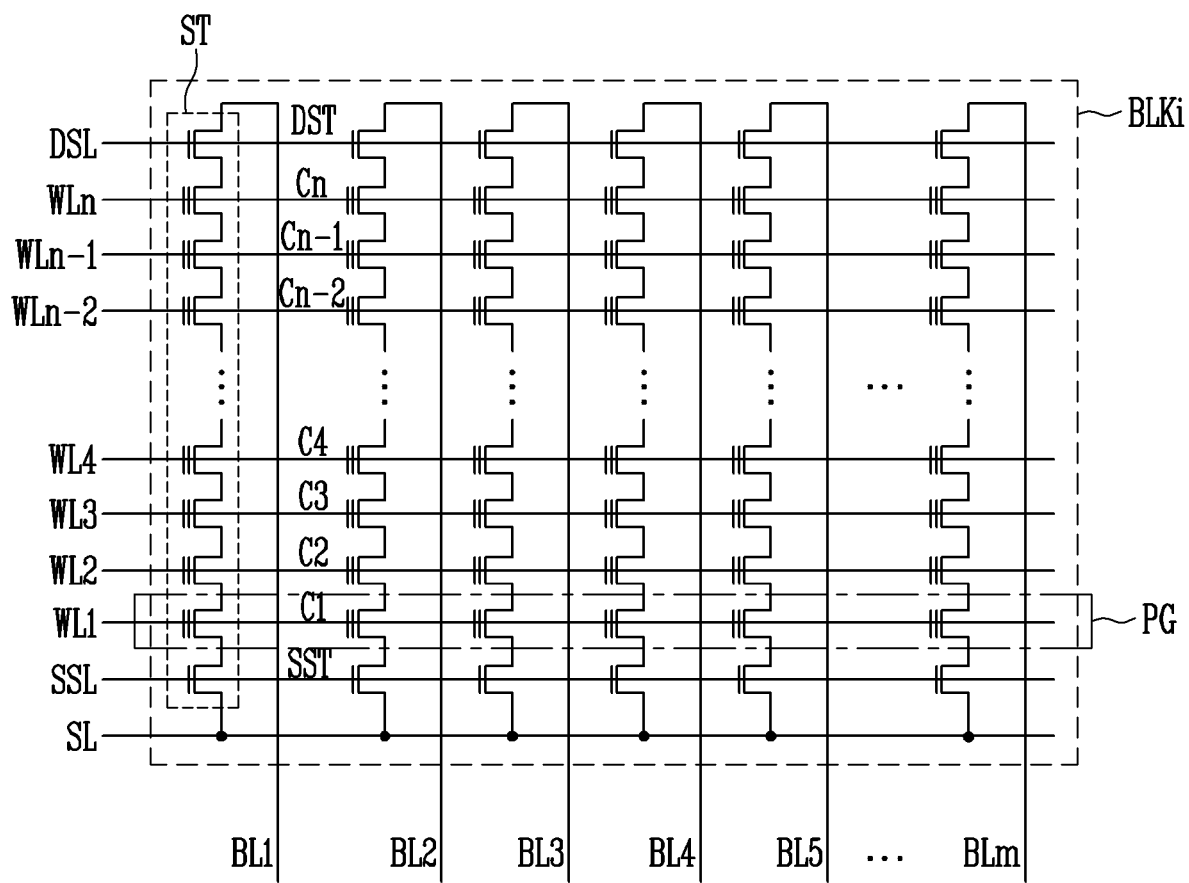
FIG. 3 is a diagram illustrating a memory block.

FIG. 3 is a diagram illustrating a representative memory block.

Referring to FIG. 3, one memory block BLKi among the plurality of memory blocks BLK1 to BLKi shown in FIG. 2 is illustrated as an embodiment.

The memory block BLKi may include a plurality of strings ST coupled between first to mth bit lines BL1 to BLm and a source line SL, where m is a positive integer of 2 or greater. Each of the strings ST may include a source select transistor SST, first to nth memory cells C1 to Cn, and a drain select transistor DST coupled in series between the source line SL and the first to mth bit lines BL1 to BLm.

The memory block BLKi shown in FIG. 3 is provided to illustrate a configuration of the memory block. Accordingly, the numbers of source select transistors SST, memory cells, and drain select transistors DST are not limited to the numbers illustrated in FIG. 3.

Gates of the source select transistors SST coupled to the different strings ST may be coupled to a source select line SSL, gates of the first to nth memory cells C1 to Cn may be coupled to first to nth word lines WL1 to WLn, respectively, and gates of the drain select transistors DST may be coupled to a drain select line DSL.

A group of memory cells coupled to the same word line and included in the different strings ST may form one page PG. A program or read operation may be performed in units of pages PG. For example, a sub-program operation or a verify operation may be performed in units of pages PG. During a program operation, after a program operation of a selected page is performed, a verify operation of the selected page may be performed. During a read operation, when a read operation of a selected page is performed, read data may be stored in page buffers.

Figure 4:
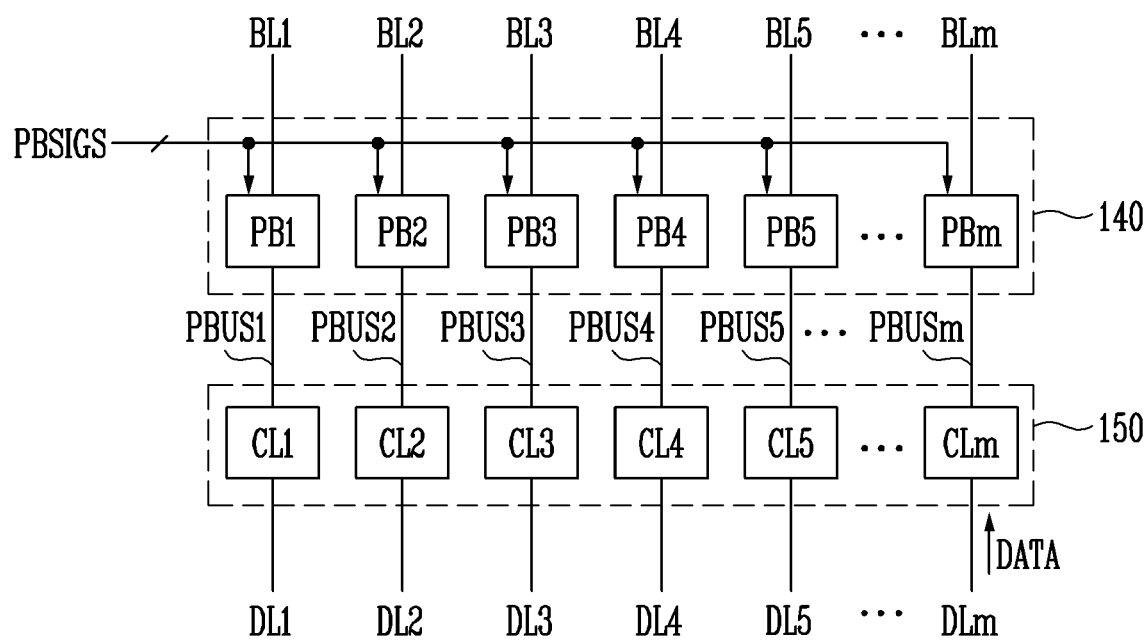
FIG. 4 is a diagram illustrating a page buffer group and a cache latch group.

FIG. 4 is a diagram illustrating the page buffer group 140 and the cache latch group 150.

Referring to FIG. 4, the page buffer group 140 may include first to mth page buffers PB1 to PBm, where m is a positive integer of 2 or greater. The first to mth page buffers PB1 to PBm may be coupled to the first to mth bit lines BL1 to BLm, respectively. The first to mth page buffers PB1 to PBm may sense a voltage or a current of the first to mth bit lines BL1 to BLm and may store the sensed data. The first to mth page buffers PB1 to PBm may receive the page buffer control signals PBSIGS in common and operate at the same time.

The cache latch group 150 may include first to mth cache latches CL1 to CLm. Each of the first to mth cache latches CL1 to CLm may be configured to store data. For example, the first to mth cache latches CL1 to CLm may temporarily store data DATA input through first to mth data lines DL1 to DLm and may transfer the data DATA to the first to mth page buffers PB1 to PBm through first to mth page bus lines PBUS1 to PBUSm, respectively, in response to control of the column decoder 160.

Figure 5:
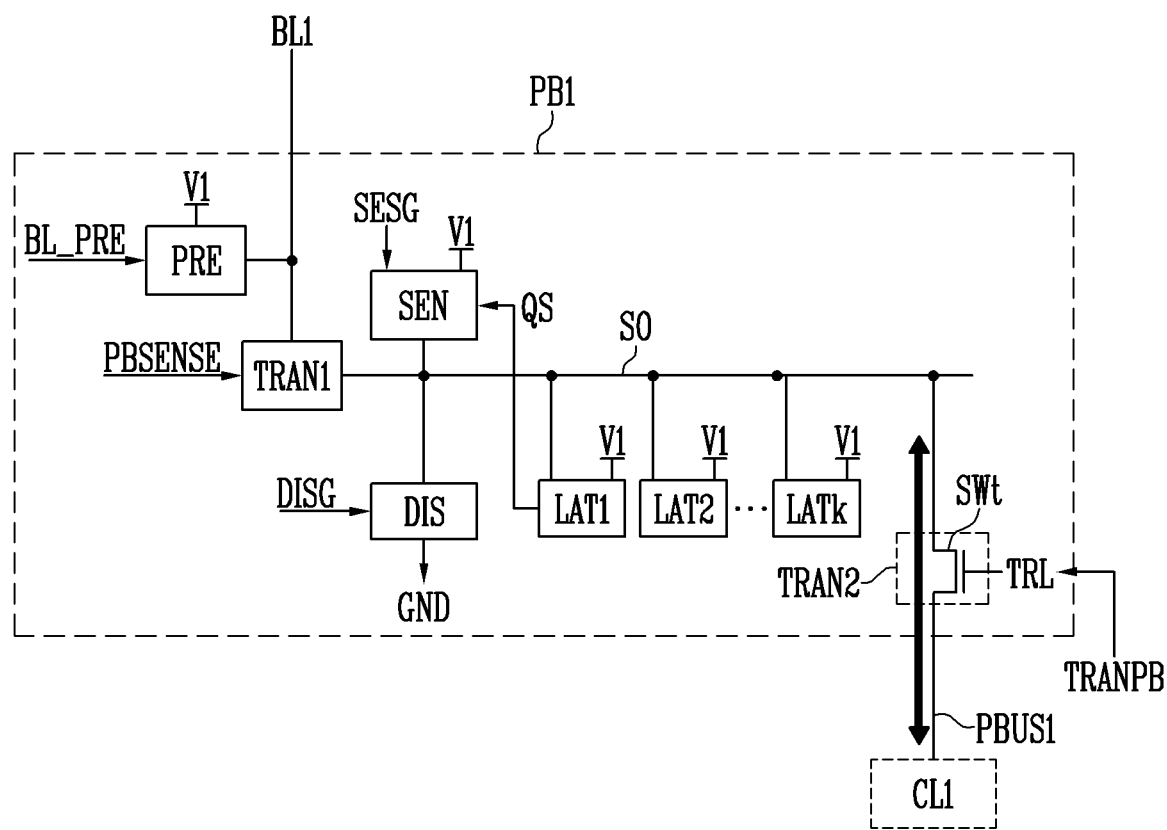
FIG. 5 is a diagram illustrating a page buffer included in a page buffer group.

FIG. 5 is a diagram illustrating a page buffer included in the page buffer group 140. The first page buffer PB1 is illustrated in FIG. 5 by way of example. Each of the other page buffers may be configured the same, or substantially the same, as PB1.

Referring to FIG. 5, the first page buffer PB1 may include a precharge circuit PRE, a first transmission circuit TRAN1, a sensing circuit SEN, a discharge circuit DIS, first to kth latches LAT1 to LATk, and a second transmission circuit TRAN2. FIG. 5 is a schematic diagram illustrating an embodiment of the representative first page buffer PB1. Accordingly, PB1, as well as each of the other page buffers, may be configured differently than the configuration shown in FIG. 5. For example, each page buffer may include one or more additional circuits not illustrated in FIG. 5.

The precharge circuit PRE may be configured to precharge the first bit line BL1. For example, the precharge circuit PRE may transfer a first voltage V1 to the first bit line BL1 to precharge the first bit line BL1 in response to a precharge signal BL_PRE. The first voltage V1 may be an internal voltage supplied to the memory device 1100. V1 is shown in FIG. 1 as a source voltage.

The first transmission circuit TRAN1 may couple the first bit line BL1 to a sensing node SO or block, i.e., decouple, connection between the first bit line BL1 and the sensing node SO in response to a first transmission signal PBSENSE.

The sensing circuit SEN may sense a voltage or a current of the first bit line BL1 in response to a sensing signal SESG and latch data QS during a verify operation or a read operation. Accordingly, the first bit line BL1 and the sensing node SO may be coupled together by the first transmission circuit TRAN1 when the sensing circuit SEN operates. The latch data QS may be input from an external device during a program operation.

The first to kth latches LAT1 to LATk may temporarily store data during the program or read operation. During the program operation, one or more of the first to kth latches LAT1 to LATk may temporarily store data input from the external device and one or more different latches of the first to kth latches LAT1 to LATk may temporarily store read data read from a memory cell during the verify operation. For example, the first latch LAT1 may temporarily store the data input from the external device and a second latch LAT2 may temporarily store the read data read by the sensing circuit SEN. The read data stored in the second latch LAT2 may be transferred to the sensing node SO during an evaluation operation for determining whether the verify operation has passed or failed. The kth latch LATk may receive the data input from the external device through the first data line DL1. For example, during the program operation, the kth latch LATk may receive the data loaded to, i.e., on, the first data line DL1 in response to a first column select signal CS1. During the read operation, the kth latch LATk may output the read data that is read in response to the first column select signal CS1 to the first data line DL1.

The first to kth latches LAT1 to LATk may operate by receiving the first voltage V1 as a source of a voltage. The first voltage V1 may be an internal voltage that may also be used as a source of a voltage of the precharge circuit PRE and the sensing circuit SEN.

The second transmission circuit TRAN2 may transfer the data loaded to the sensing node SO to the first cache latch CL1 through the first page bus line PBUS1 in response to a second transmission signal TRANPB provided through a transmission line TRL. For example, the second transmission circuit TRAN2 may include a transmission switch SWt that may be turned on or turned off in response to the second transmission signal TRANPB. The transmission switch SWt may be embodied as an NMOS transistor. When the second transmission signal TRANPB is enabled at a voltage greater than a threshold voltage, the transmission switch SWt may be turned on. Accordingly, the data loaded to the sensing node SO may be transferred to the first cache latch CL1 through the first page bus line PBUS1. The transmission switch SWt may be turned on at a sufficient voltage level to transfer data from the sensing node SO to the first page bus line PBUS1. That is because the read data loaded to the sensing node SO may be quickly transferred to the first cache latch CL1 only when the transmission switch SWt is turned on at a sufficient voltage level.

Figure 6:
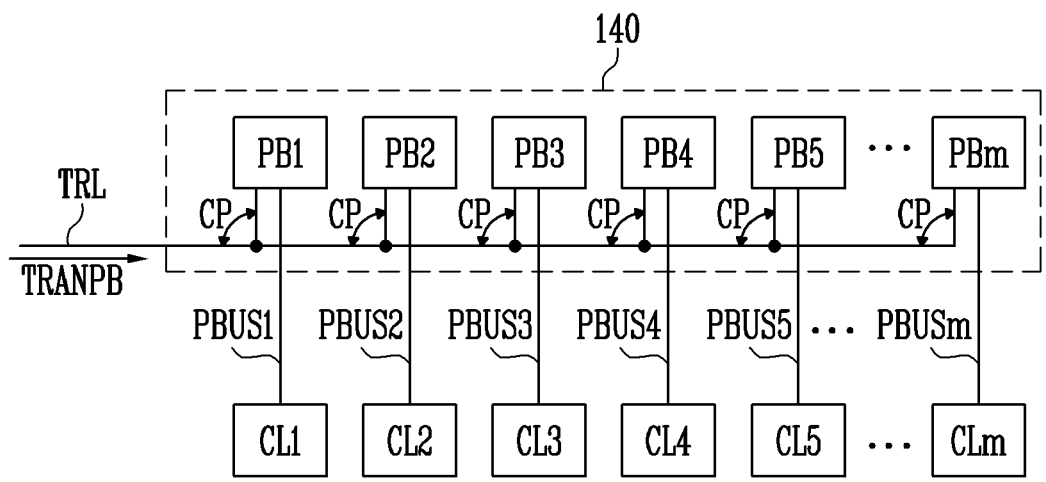
FIG. 6 is a diagram illustrating a voltage drop occurring in a transmission line.
Figure 7:
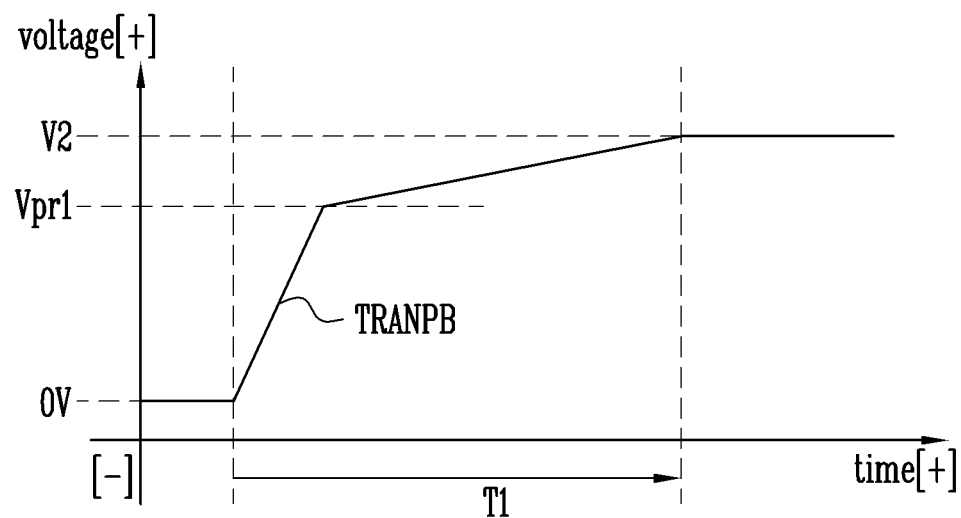
FIG. 7 is a diagram illustrating a voltage of a transmission signal when a voltage drop occurs in a transmission line.

FIG. 6 is a diagram illustrating a voltage drop occurring in the transmission line TRL. FIG. 7 is a diagram illustrating a voltage of a transmission signal when a voltage drop occurs in the transmission line TRL.

Referring to FIG. 6, the first to mth page buffers PB1 to PBm may operate at the same time in response to the page buffer control signals PBSIGS shown in FIG. 1. The page buffer control signals PBSIGS may include a plurality of signals for controlling the first to mth page buffers PB1 to PBm. The second transmission signal TRANPB may be one of the plurality of signals included in the page buffer control signals PBSIGS. The second transmission signal TRANPB may be output from the logic circuit 180 shown in FIG. 1 through the transmission line TRL. Because the transmission line TRL is coupled to the first to mth page buffers PB1 to PBm in common, the second transmission signal TRANPB output from the logic circuit 180 may be transferred to the first to mth page buffers PB1 to PBm at the same time. Accordingly, when the second transmission signal TRANPB is applied to the transmission line TRL, an amount of current may be temporarily increased to fill capacitance CP that may be defined between the transmission line TRL and each of the first to mth page buffers PB1 to PBm. Accordingly, a voltage of the second transmission signal TRANPB may drop, and thus a voltage level of the second transmission signal TRANPB may be slowly increased during a set time. The voltage level of the second transmission signal TRANPB applied to the transmission line TRL is described below in more detail.

Referring to FIG. 7, a second voltage V2 may be used to enable the second transmission signal TRANPB. The second voltage V2 may greater than the first voltage V1 and may be output from a pump (not shown). For example, the pump (not shown) may output the second voltage V2, which is greater than the first voltage V1, by pumping the first voltage V1. Even when the second voltage V2 is greater than the first voltage V1, when the second voltage V2 is applied to the transmission line TRL having a potential of 0V, the voltage level of the second transmission signal TRANPB may be increased to a first pre-voltage Vpr1 as an amount of current of the transmission line TRL is increased. The first pre-voltage Vpr1 may be less than the second voltage V2 which is a target voltage of TRANPB. When the voltage level of the second transmission signal TRANPB is increased to the first pre-voltage Vpr1 and then the amount of current of the transmission line TRL is decreased, the voltage level of the second transmission signal TRANPB may be increased from the first pre-voltage Vpr1 to the second voltage V2. Because the amount of current may be slowly decreased by the capacitance CP of the transmission line TRL, the voltage level of the second transmission signal TRANPB may be slowly increased to the second voltage V2. As illustrated in FIG. 7, when the second transmission signal TRANPB is momentarily applied to the transmission line TRL in a state where the potential of the transmission line TRL is 0V, it may take a first time T1 for the voltage level of the second transmission signal TRANPB to increase to the second voltage V2.

Thereby, according to an embodiment, a circuit outputting the second transmission signal TRANPB to reduce the first time T1 may be provided.

Figure 8:
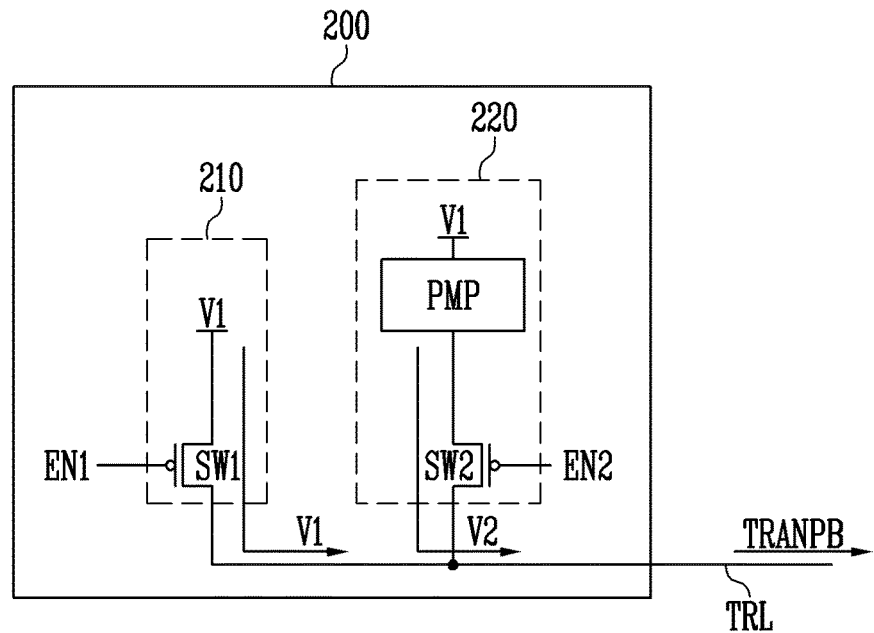
FIG. 8 is a diagram illustrating a pump voltage output circuit according to an embodiment of the present disclosure.

FIG. 8 is a diagram illustrating the pump voltage output circuit 200 according to an embodiment of the present disclosure.

Referring to FIG. 8, the pump voltage output circuit 200 may include a first voltage output circuit 210 and a second voltage output circuit 220.

The first voltage output circuit 210 may be configured to output the first voltage V1 to the transmission line TRL in response to a first enable signal EN1. The second voltage output circuit 220 may be configured to output the second voltage V2 to the transmission line TRL in response to a second enable signal EN2.

The first voltage output circuit 210 may include a first switch SW1 coupled between a terminal to which the first voltage V1 is provided and the transmission line TRL. The first switch SW1 may be embodied as a PMOS transistor which transfers the first voltage V1 to the transmission line TRL in response to the first enable signal EN1.

The second voltage output circuit 220 may include a pump PMP configured to generate the second voltage V2 by pumping the first voltage V1 and a second switch SW2 configured to output the second voltage V2 to the transmission line TRL in response to the second enable signal EN2.

The voltage level of the second transmission signal TRANPB output through the transmission line TRL may vary according to a voltage output from the first voltage output circuit 210 and the second voltage output circuit 220. For example, the first voltage output circuit 210 may output the first voltage V1 through the transmission line TRL before the second voltage output circuit 220 outputs the second voltage V2. In other words, the transmission line TRL may be precharged with the first voltage V1 before the second voltage V2 is output.

When the second voltage output circuit 220 outputs the second voltage V2 through the transmission line TRL in a state where the transmission line TRL is precharged with the first voltage V1, a potential of the transmission line TRL may be quickly increased to a target level, which is the second voltage V2.

In other words, when the first voltage V1 is already applied to the transmission line TRL before the second voltage V2 is output to the transmission line TRL, the capacitance CP shown in FIG. 6 between the transmission line TRL and each of the first to mth page buffers PB1 to PBm shown in FIG. 6 may be filled. When the second voltage V2 is applied to the transmission line TRL in a state where the capacitance CP is filled, a phenomenon in which an amount of current of the transmission line TRL is rapidly increased may be mitigated, and thus the potential of the transmission line TRL may be quickly increased to the second voltage V2.

An operation of the pump voltage output circuit 200 is described below in more detail.

Figure 9:
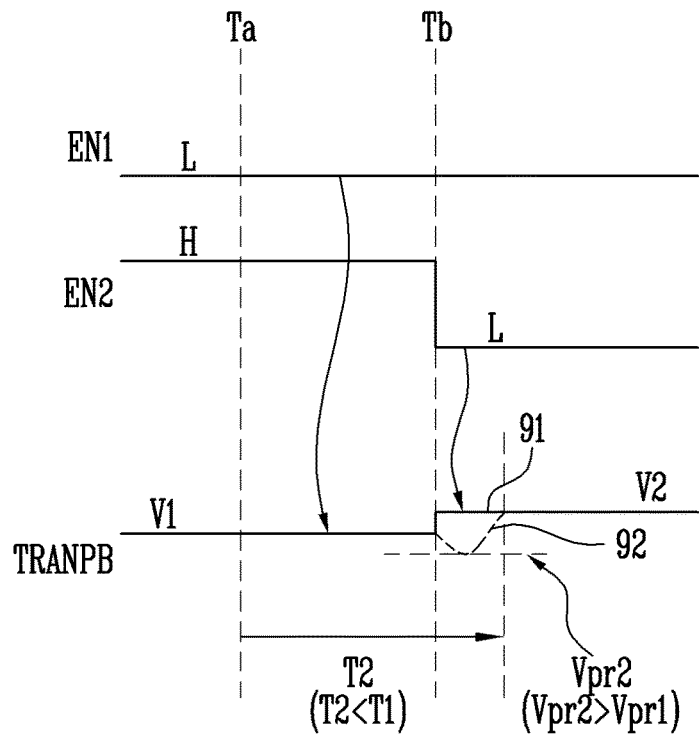
FIG. 9 is a diagram illustrating a method of operating a pump voltage output circuit.

FIG. 9 is a diagram illustrating a method of operating the pump voltage output circuit 200.

Referring to FIGS. 8 and 9, the pump voltage output circuit 200 may activate the first enable signal EN1 to a low level L before the second voltage V2 is output. For example, the pump voltage output circuit 200 may output the second transmission signal TRANPB having a level of the first voltage V1 by activating the first enable signal EN1 to the low level L prior to a time Ta. In one type of system that has been proposed, the time Ta may be when the second voltage V2 starts to be output to the transmission line TRL. However, according to an embodiment of the present disclosure, the first voltage V1 may be applied to the transmission line TRL prior to the time Ta. In other words, according to an embodiment, the transmission line TRL may be precharged with the first voltage V1 before the second voltage V2 is applied to the transmission line TRL.

The pump voltage output circuit 200 may output the second voltage V2 by activating the second enable signal EN2 to the low level L at a time Tb when the transmission line TRL is precharged with the first voltage V1. The second voltage V2 may be greater than the first voltage V1 and the first voltage V1 may be greater than 0V.

Accordingly, when the second transmission signal TRANPB is output to the first to mth page buffers PB1 to PBm included in the page buffer group 140 shown in FIG. 6, the first voltage V1 is applied to the transmission line TRL in advance, and thus the capacitance CP shown in FIG. 6 of the transmission line TRL may be charged in advance. Accordingly, when the second voltage V2 is applied to the transmission line TRL at the time Tb, the second voltage V2 may be applied to the transmission line TRL without a voltage drop (91).

Alternatively, when the second voltage V2 is applied to the transmission line TRL at the time Tb, a current of the transmission line TRL may be temporarily increased and a voltage level of the second transmission signal TRANPB may be temporarily decreased (92). However, even when the voltage level of the second transmission signal TRANPB is temporarily decreased to a second pre-voltage Vpr2 (92), because the transmission line TRL is precharged with the first voltage V1, the second pre-voltage Vpr2 may be greater than the first pre-voltage Vpr1 shown in FIG. 7. Accordingly, a time for the voltage level of the second transmission signal TRANPB to temporarily decrease to a level of the second pre-voltage Vpr2 and then to be restored to the level of the second voltage V2 may be short.

Accordingly, a second time T2 taken for the voltage level of the transmission line TRL to increase to the second voltage V2 from the time Ta may be shorter than the first time T1 shown in FIG. 7.

As described above, because the time taken for the second voltage V2 having a target level to be applied to the transmission line TRL is shortened, a time taken for data to be transferred between the page buffers and the cache latches may be shortened. Accordingly, a time taken to perform a program operation or a read operation of a memory device may be shortened.

Figure 10:
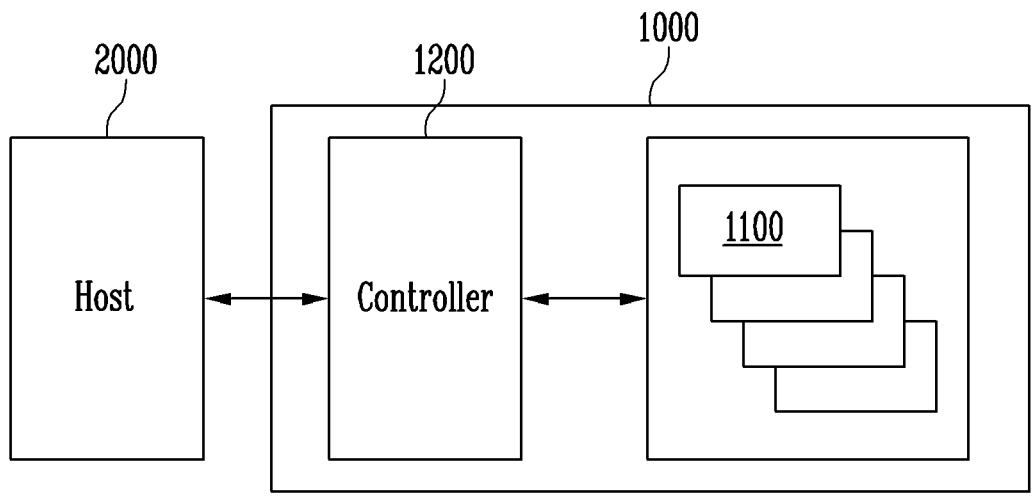
FIG. 10 is a diagram illustrating a memory system including a memory device according to an embodiment of the present disclosure.

FIG. 10 is a diagram illustrating a memory system 1000 including the memory device 1100 according to an embodiment of the present disclosure.

Referring to FIG. 10, the memory system 1000 may include the memory device 1100 and a controller 1200 communicating between the memory device 1100 and a host 2000.

Further, the memory device 1100 may be configured as the memory device 1100 shown in FIG. 1.

The memory system 1000 may include a plurality of memory devices 1100 and the memory devices 1100 may be coupled to the controller 1200 through at least one channel. For example, the plurality of memory devices 1100 may be coupled to a single channel. In a case where a plurality of channels are coupled to the controller 1200, the plurality of memory devices 1100 may be coupled to the channels, respectively.

The controller 1200 may communicate between the host 2000 and the memory device 1100. The controller 1200 may control the memory device 1100 in response to a request of the host 2000 or may perform a background operation for improving performance of the memory system 1000 without a request from the host 2000. The host 2000 may generate requests for various operations and may output the generated requests to the memory system 1000. For example, the requests may include a program request for controlling a program operation, a read request for controlling a read operation, or an erase request for controlling an erase operation.

The host 2000 may communicate with the memory system 1000 through any of various interfaces such as Peripheral Component Interconnect Express (PCIe), Advanced Technology Attachment (ATA), Serial ATA (SATA), Parallel ATA (PATA), a serial attached SCSI (SAS), Non-Volatile Memory Express (NVMe), a Universal Serial Bus (USB), a Multi-Media Card (MMC), an Enhanced Small Disk Interface (ESDI), or Integrated Drive Electronics (IDE).

Figure 11:
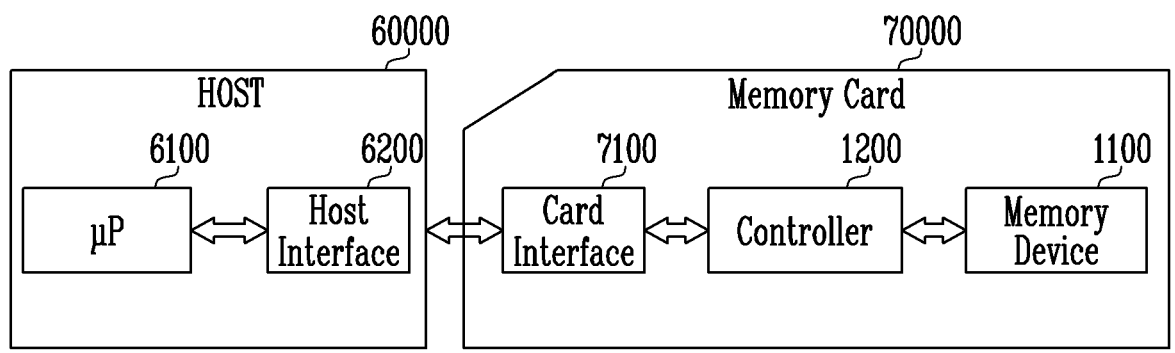
FIG. 11 is a diagram illustrating a memory system including a memory device according to another embodiment of the present disclosure.

FIG. 11 is a diagram illustrating a memory system including the memory device 1100 according to another embodiment of the present disclosure.

Referring to FIG. 11, a memory system 70000 may be embodied as a memory card or a smart card. The memory system 70000 may include the memory device 1100, the controller 1200 and a card interface 7100.

Further, the memory device 1100 may be configured as the memory device 1100 shown in FIG. 1.

The controller 1200 may control data exchange between the memory device 1100 and the card interface 7100. According to an embodiment, the card interface 7100 may be, but is not limited to, a secure digital (SD) card interface or a multi-media card (MMC) interface.

The card interface 7100 may interface data exchange between a host 60000 and the controller 1200 according to a protocol of the host 60000. According to an embodiment, the card interface 7100 may support a Universal Serial Bus (USB) protocol and an InterChip (IC)-USB protocol. The card interface 7100 may refer to hardware that supports a protocol used by the host 60000, software mounted on the hardware, or a signal transmission method.

When the memory system 70000 is connected to an host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the controller 1200 in response to control of a microprocessor (μP) 6100.

According to embodiments of the present disclosure, an operation time of a memory device may be shortened and reliability of the memory device may be improved by suppressing a voltage drop of a signal controlling page buffers included in the memory device.

While embodiments of the invention have been illustrated and described, those skilled in the art will recognize in light of the present disclosure that various modifications may be made within the spirit and scope of the invention. The present invention encompasses all such modifications that fall within the scope of the claims.

What is claimed is:

1. A memory device, comprising:
   a latch configured to sense a voltage or a current of a bit line coupled to a memory cell and store read data;
   a transmission circuit configured to output the read data stored in the latch through a page bus line in response to a transmission signal;
   a cache latch configured to receive the read data through the page bus line and temporarily store the read data; and
   a pump voltage output circuit coupled to the transmission circuit through a transmission line and configured to apply a second voltage greater than a first voltage after applying the first voltage to the transmission line for a set time.

2. The memory device of claim 1, wherein the cache latch is configured to transfer data input from an external device to the latch through the page bus line during a program operation.

3. The memory device of claim 1, wherein the transmission circuit includes a switch electrically coupling or decoupling the latch and the transmission line in response to the transmission signal.

4. The memory device of claim 3, wherein the switch is configured to turn-on in response to the transmission signal.

5. The memory device of claim 1, wherein the pump voltage output circuit comprises:
   a first voltage output circuit configured to output the first voltage in response to a first enable signal; and
   a second voltage output circuit configured to output the second voltage in response to a second enable signal.

6. The memory device of claim 5, wherein the first voltage output circuit includes a first switch coupled between a terminal to which the first voltage is applied and the transmission line and transferring the first voltage to the transmission line in response to the first enable signal.

7. The memory device of claim 5, wherein the second voltage output circuit includes a pump and a second switch coupled in series between a terminal to which the first voltage is applied and the transmission line.

8. The memory device of claim 7, wherein the pump generates the second voltage by pumping the first voltage, and the second switch transfers the second voltage to the transmission line in response to the second enable signal.

9. The memory device of claim 8, wherein, after transferring the first voltage to the transmission line using the first voltage output circuit, the pump voltage output circuit transfers the second voltage to the transmission line using the second voltage output circuit.

10. A memory device, comprising:
a switch transferring data on a first line to a second line in response to a transmission signal, wherein a plurality of latches are coupled in parallel to the second line; and
a pump voltage output circuit coupled to a gate of the switch and outputting the transmission signal to the gate,
wherein the pump voltage output circuit is configured to:
apply a first voltage generated from a first voltage source to the gate before the data is transferred to the second line; and
generate the transmission signal having a second voltage generated from a second voltage source and greater than the first voltage, and apply the transmission signal to the gate to transfer the data to the second line.

11. The memory device of claim 10, wherein the pump voltage output circuit comprises:
a first voltage output circuit configured to output the first voltage to the gate in response to a first enable signal; and
a second voltage output circuit configured to output the second voltage to the gate in response to a second enable signal.

12. The memory device of claim 11, wherein, after outputting the first voltage to the gate using the first voltage output circuit, the pump voltage output circuit outputs the second voltage to the gate using the second voltage output circuit.

13. The memory device of claim 11, wherein the first voltage output circuit includes a transistor transferring the first voltage to the gate in response to the first enable signal.

14. The memory device of claim 11, wherein the second voltage output circuit comprises:
a pump generating the second voltage by pumping the first voltage; and
a transistor transferring the second voltage to the gate in response to the second enable signal.

15. The memory device of claim 10, wherein the switch is embodied as a transistor having a turn-on level that is adjusted according to a level of the transmission signal.

16. A method of operating a memory device, the method comprising:
storing read data in a latch of a page buffer by reading a memory cell;
precharging a gate of a transmission switch coupled between the latch and a cache latch by applying a first voltage to the gate; and
turning on, when the gate is precharged, the transmission switch by applying a second voltage greater than the first voltage to the gate.

17. The method of claim 16, wherein the first voltage is a positive voltage.

18. The method of claim 16, wherein the first voltage is supplied as a source of a voltage of circuits included in the page buffer.

* * * * *